(12) United States Patent
Madisetti et al.

(10) Patent No.: US 7,800,521 B2
(45) Date of Patent: Sep. 21, 2010

(54) NONLINEAR COMPENSATION IN ANALOG TO DIGITAL CONVERTERS

(75) Inventors: Avanindra Madisetti, Coto de Caza, CA (US); Thomas D. Kwon, Irvine, CA (US); Aaron W. Buchwald, Newport Coast, CA (US)

(73) Assignee: Mobius Semiconductor, Inc., Irvine, CA (US)

( * ) Notice: Subject to any disclaimer, the term of this patent is extended or adjusted under 35 U.S.C. 154(b) by 15 days.

(21) Appl. No.: 12/341,550

(22) Filed: Dec. 22, 2008

(65) Prior Publication Data

US 2010/0033359 A1    Feb. 11, 2010

Related U.S. Application Data

(60) Provisional application No. 61/086,266, filed on Aug. 5, 2008.

(51) Int. Cl.
*H03M 1/06* (2006.01)

(52) U.S. Cl. .................................. 341/118; 341/155
(58) Field of Classification Search ......... 341/118–121, 341/155, 138
See application file for complete search history.

(56) References Cited

U.S. PATENT DOCUMENTS

| | | | |
|---|---|---|---|
| 6,690,311 B2* | 2/2004 | Lundin et al. | 341/120 |
| 6,967,603 B1* | 11/2005 | Lin | 341/120 |
| 7,369,027 B2* | 5/2008 | Choi et al. | 336/200 |

* cited by examiner

*Primary Examiner*—Brian Young
(74) *Attorney, Agent, or Firm*—Kauth, Pomeroy, Peck & Bailey LLP

(57) ABSTRACT

An apparatus for converting an analog signal to a digital signal comprising a first analog to digital converter for generating a first digital value from an analog value. A second analog to digital converter for generating a second digital value from the analog value. Logic for determining a correction factor for the second digital value based on a difference between the first digital value and the second digital value, wherein the logic updates the correction factor.

18 Claims, 8 Drawing Sheets

NONLINEAR COMPENSATION IN ANALOG TO DIGITAL CONVERTERS

RELATED APPLICATIONS

This application claims priority to provisional U.S. application 61/086,266, filed Aug. 5, 2008, which is hereby incorporated by reference for all purposes.

FIELD OF THE INVENTION

The invention relates to analog to digital converters, and more particularly to nonlinear compensation in analog to digital converters that improves accuracy.

BACKGROUND OF THE INVENTION

Lower power and higher speed analog to digital converters can be obtained by using lower accuracy analog components. The accuracy can be recovered by digitally post-processing the output of the analog to digital converter. This invention describes a method to identify and correct for the nonlinearities and mismatches in the analog components.

SUMMARY OF THE INVENTION

In accordance with the present invention, an apparatus and method for nonlinear compensation in analog to digital converters are provided, which increased the accuracy of high speed analog to digital converters.

In accordance with an exemplary embodiment of the present invention, an apparatus for converting an analog signal to a digital signal is provided. The apparatus includes a first analog to digital converter for generating a first digital value from an analog value, such as a high accuracy digital value that is generated over a first time period. A second analog to digital converter generates a second digital value from the analog value, such as a lower accuracy digital value that is generated in less time than the first time period. Logic determines a correction factor for the second digital value based on a difference between the first digital value and the second digital value, wherein the logic updates the correction factor each time a new analog value is processed.

Those skilled in the art will further appreciate the advantages and superior features of the invention together with other important aspects thereof on reading the detailed description that follows in conjunction with the drawings.

DETAILED DESCRIPTION OF PREFERRED EMBODIMENTS

Figure 1:
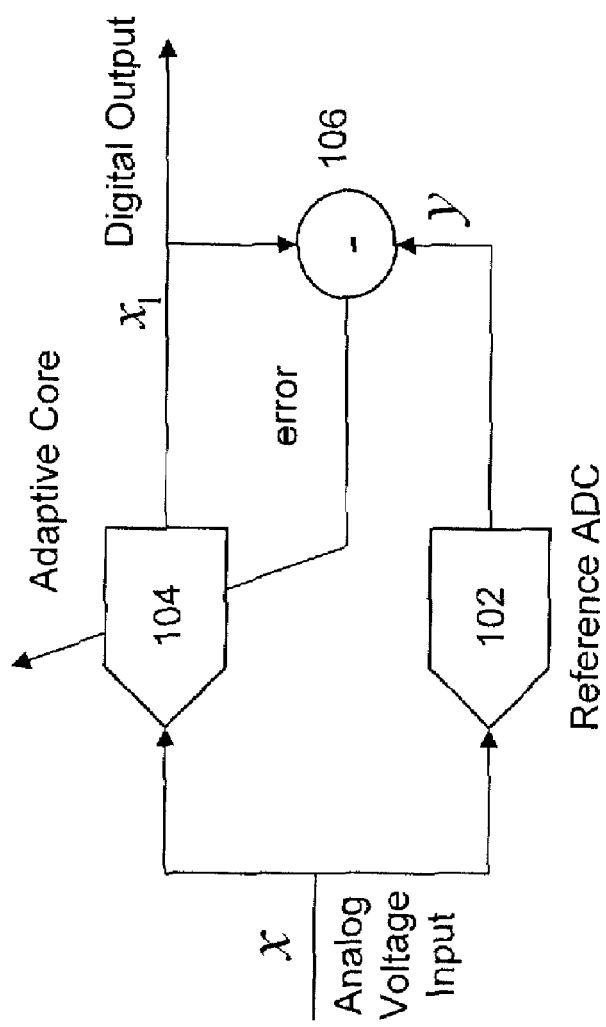
FIG. 1 is a diagram of a system for an adaptive analog to digital converter in accordance with an exemplary embodiment of the present invention.

In the description that follows, like parts are marked throughout the specification and drawings with the same reference numerals, respectively. The drawing figures might not be to scale and certain components can be shown in generalized or schematic form and identified by commercial designations in the interest of clarity and conciseness.

FIG. 1 is a diagram of a system 100 for an adaptive analog to digital converter in accordance with an exemplary embodiment of the present invention. System 100 uses an adaptive core to compensate for manufacturing variances in and non-linearity of the circuit components of system 100 to generate more accurate analog to digital conversion values.

System 100 can be implemented in hardware or a suitable combination of software and hardware, such as one or more discrete circuit components such as transistors and capacitors operating in conjunction with a digital signal processor, a field programmable gate array, an application specific integrated circuit or other suitable components. System 100 includes reference analog to digital converter 102, which is a high accuracy analog to digital converter that operates at a first conversion speed. System 100 also includes adaptive core 104, which includes a lower accuracy analog to digital converter stage that operates at a second conversion speed that is faster than the conversion speed of reference analog to digital converter 102. The faster speed of adaptive core is obtained using lower cost and lower power components, but results in inaccurate analog to digital conversion processing. In order to improve the accuracy of adaptive core 104, it is necessary to determine the error created by adaptive core 104 and to compensate for that error.

In order to compensate for the inaccuracy of the faster analog to digital conversion stage of the adaptive core, subtractor 106 is used to generate an error signal that is fed back to adaptive core 104. Adaptive core 104 includes iterative logic that compensates the output of the high speed but inaccurate analog to digital converter of adaptive core 104 to yield an accurate conversion value that compensates for variances in and non-linearity of the analog to digital converter of adaptive core 104. Because reference analog to digital converter 102 operates at a slower conversion rate than adaptive core 104, the error signal is only valid at predetermined times, and the subtractor 106 or other suitable components of adaptive core 104 include buffers to store the converted analog signal from adaptive core 104 that corresponds to the converted analog signal from reference analog to digital converter 102. Adaptive logic of adaptive core 104 is used to determine the errors generated by the components of adaptive core 104, and to correct the generated digital codes to compensate for these errors.

Figure 2:
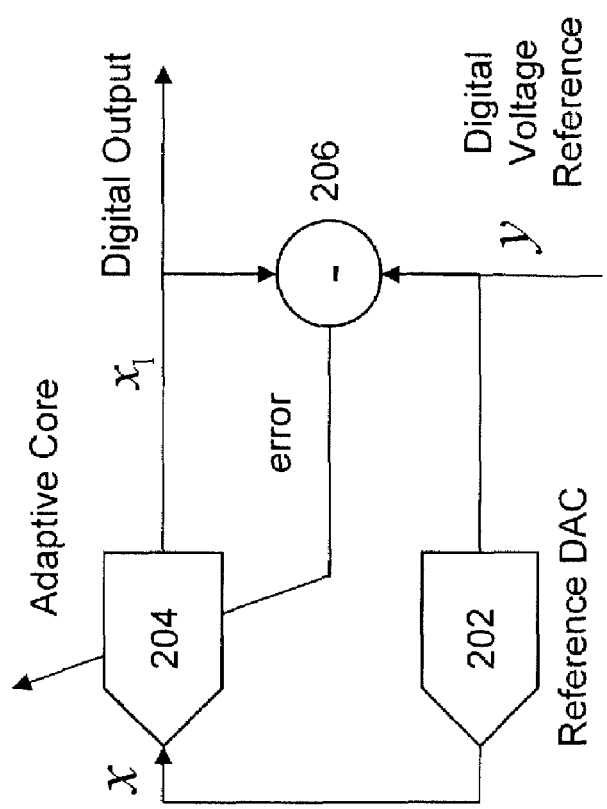
FIG. 2 is a diagram of a system for an adaptive analog to digital converter in accordance with an exemplary embodiment of the present invention.

FIG. 2 is a diagram of a system 200 for an adaptive analog to digital converter in accordance with an exemplary embodiment of the present invention. System 200 uses an adaptive core to compensate for manufacturing variances in and non-linearity of the circuit components of system 200 to generate more accurate analog to digital conversion values.

System 200 can be implemented in hardware or a suitable combination of software and hardware, such as one or more discrete circuit components such as transistors and capacitors operating in conjunction with a digital signal processor, a field programmable gate array, an application specific integrated circuit or other suitable components. System 200 includes reference digital to analog converter 202, which is a high accuracy digital to analog converter that operates at a first conversion speed. System 200 also includes adaptive core 204, which includes a lower accuracy analog to digital converter stage that operates at a second conversion speed that is faster than the conversion speed of reference digital to analog converter 202. The faster speed of adaptive core is obtained using lower cost and lower power components, but results in inaccurate analog to digital conversion processing. In order to improve the accuracy of adaptive core 204, it is necessary to determine the error created by adaptive core 204 and to compensate for that error.

In order to compensate for the inaccuracy of the faster analog to digital conversion stage of the adaptive core, subtractor 206 is used to generate an error signal that is fed back to adaptive core 204. Adaptive core 204 includes iterative logic that compensates the output of the high speed but inaccurate analog to digital converter of adaptive core 204 to yield an accurate conversion value that compensates for variances in and non-linearity of the analog to digital converter of adaptive core 204. Because reference digital to analog converter operates at a slower conversion rate than adaptive core 204, the error signal is only valid at predetermined times, and the subtractor 206 or other suitable components of adaptive core 204 include buffers to store the converted analog signal from adaptive core 204 that corresponds to the converted analog signal from reference digital to analog converter 202. Adaptive logic of adaptive core 204 is used to determine the errors generated by the components of adaptive core 204, and to correct the generated digital codes to compensate for these errors.

Figure 3:
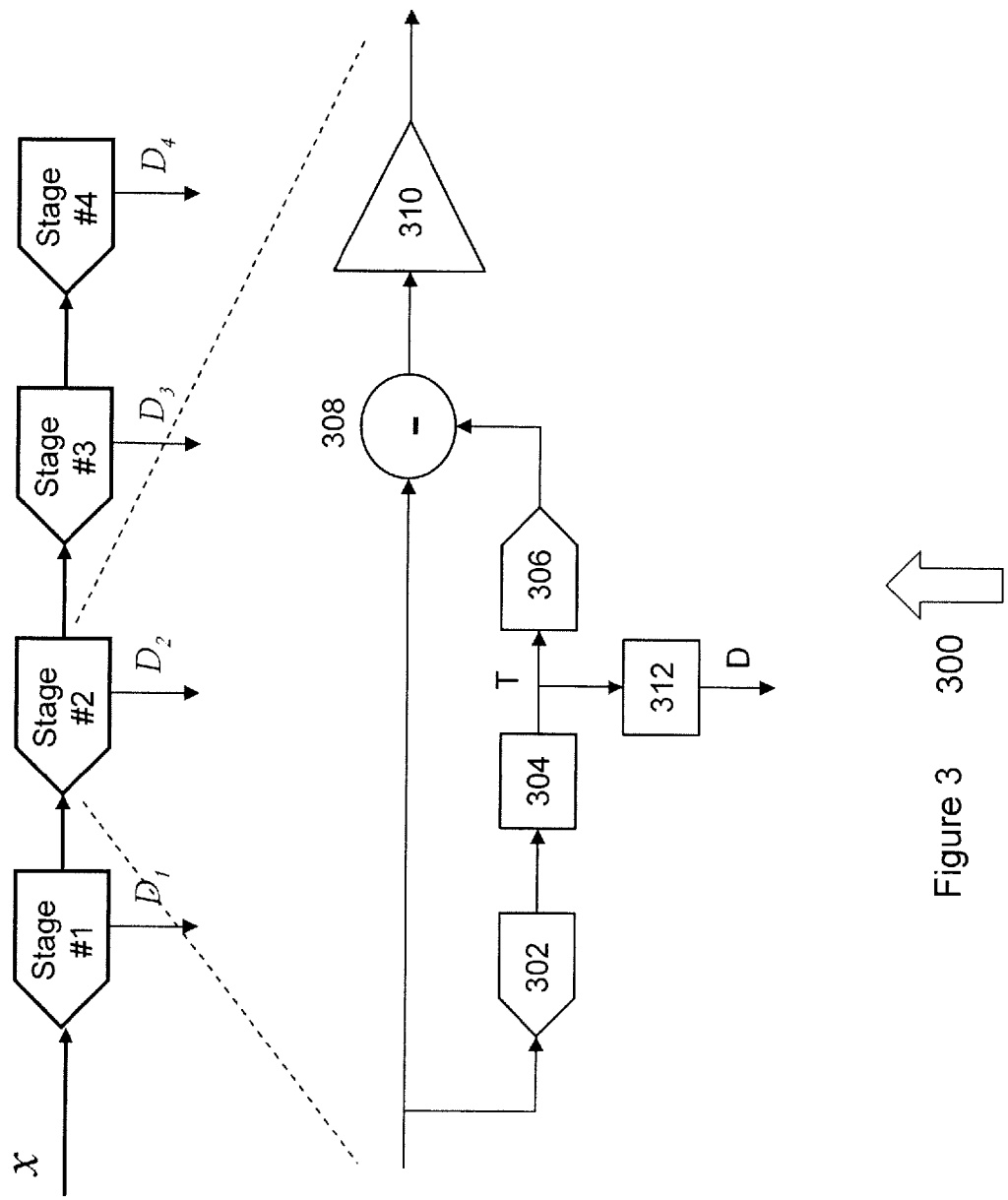
FIG. 3 is a diagram of a system for an four stage pipelined adaptive core in accordance with an exemplary embodiment of the present invention.

FIG. 3 is a diagram of a stage of the analog to digital converter. An exemplary 4-bits per stage architecture is shown with 4 stages, but any number of bits or stages can also or alternatively be resolved. System 300 includes the lower resolution analog to digital converter 302, which generates thermometer codes based on the voltage input.

In this exemplary embodiment, reference 4-bit analog to digital converter 302 may generate the following 14 digital thermometer codes, which represent the associated analog voltage input for an input voltage that can vary from −1.0 volts to 1.0 volts:

| Input voltage range | Thermometer code Generated by 302 | Digital Code Generated by 312 | Analog Output Of DAC Generated by 306 |
|---|---|---|---|
| <−13/14 | 00000000000000 | −7 | −1.0 |
| −13/14 to −11/14 | 00000000000001 | −6 | −12/14 |
| −11/14 to −9/14 | 00000000000011 | −5 | −10/14 |
| −9/14 to −7/14 | 00000000000111 | −4 | −8/14 |
| −7/14 to −5/14 | 00000000001111 | −3 | −6/14 |
| −5/14 to −3/14 | 00000000011111 | −2 | −4/14 |
| −3/14 to −1/14 | 00000000111111 | −1 | −2/14 |
| −1/14 to 1/14 | 00000001111111 | 0 | 0 |
| 1/14 to 3/14 | 00000011111111 | 1 | 2/14 |
| 3/14 to 5/14 | 00000111111111 | 2 | 4/14 |
| 5/14 to 7/14 | 00001111111111 | 3 | 6/14 |
| 7/14 to 9/14 | 00011111111111 | 4 | 8/14 |
| 9/14 to 11/14 | 00111111111111 | 5 | 10/14 |
| 11/14 to 13/14 | 01111111111111 | 6 | 12/14 |
| >13/14 | 11111111111111 | 7 | 1.0 |

Randomizer 304 receives the thermometer codes and randomly reorders them. The randomizer may be disabled or bypassed. When bypassed, the thermometer code is used by the summing decode 312 to generate a digital code D representing the associated voltage range for that stage of the analog to digital converter. Alternatively, the output of the randomizer 304 is processed by a summing decode 312 to generate the digital code D. Digital to analog converter 306 generates an analog value based on the randomized thermometer code generated by analog to digital converter 302 and 304. The analog value is designed to nominally be at the center of the input voltage range that corresponds to the thermometer code. For example, the analog outputs that are generated for the corresponding thermometer codes are shown in the above table. The digital to analog converter 306 in this exemplary embodiment is comprised of 14 unit elements. Exemplary unit elements can include unit capacitors, unit current cells or other suitable components. In this exemplary embodiment, unit capacitors are used. Each unit capacitor in the digital to analog converter 306 has a weight of exactly 1/14 in this exemplary embodiment. The digital to analog converter 306 generates an analog value based on the thermometer code by performing a weighted summation of the unit elements. A thermometer code of '0' corresponds to a weight of −1 and a thermometer code of '1' corresponds to a weight of 1 for the corresponding unit capacitor.

The output of the digital to analog converter 306 is subtracted from the voltage input by the subtractor 308, and the difference value is amplified by amplifier 310. The output of the amplifier 310 is then processed by a subsequent stage when higher accuracy is desired. Thus, when high accuracy is required, each stage is used to generate an amplified analog voltage that is processed by subsequent stages to generate additional digital data representing the analog voltage input.

The analog to digital converter of the adaptive cores does not result in high accuracy conversion of the analog voltage input or the subsequent re-conversion of the thermometer code to an analog value. For example, due to capacitance value variations in the digital to analog converter or amplifier non-linearity, the output voltage for a stage might not equal the desired value. This would result in inaccurate conversion in subsequent stages. A number of different processes can be used to correct for the above errors, as described below.

Figure 4:
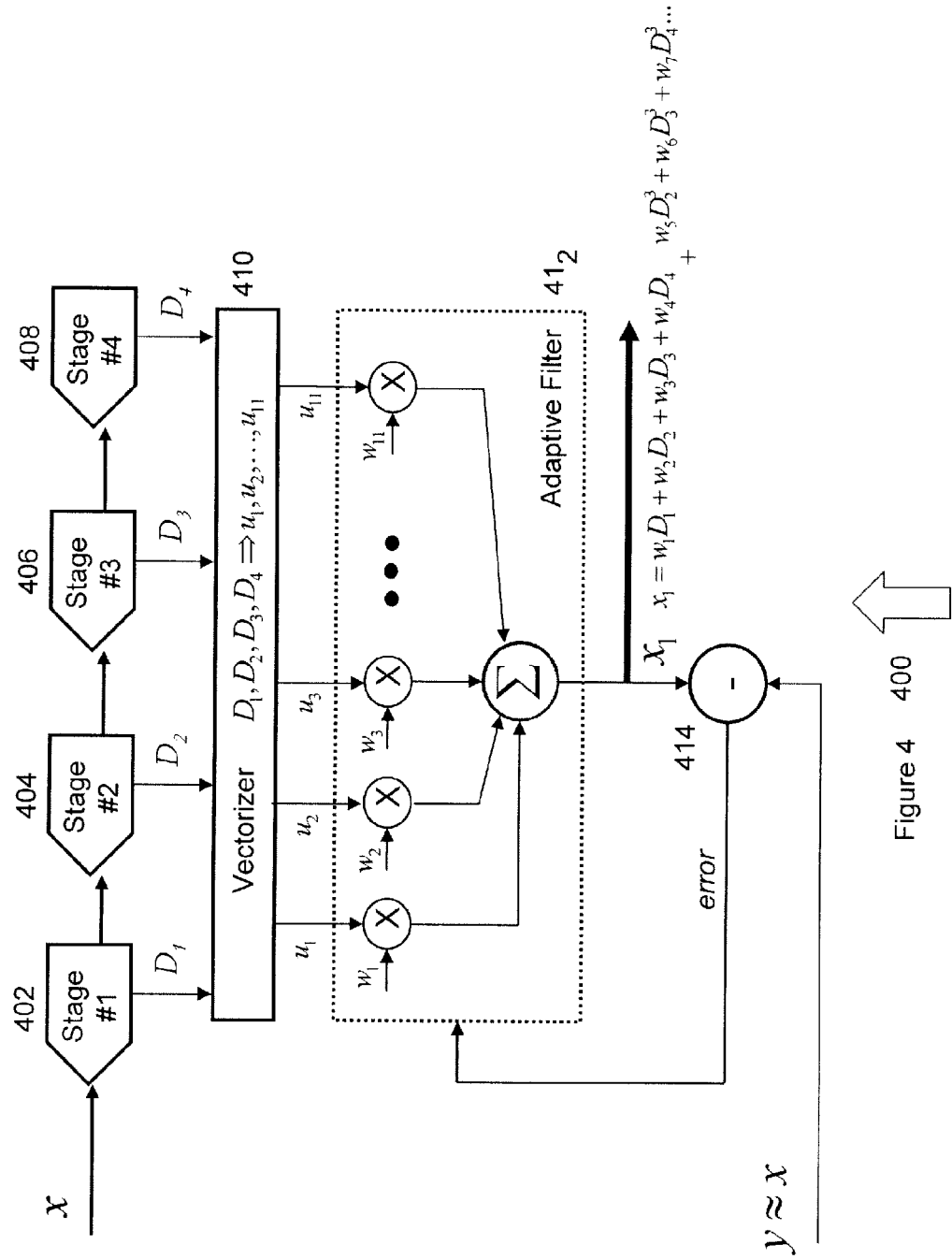
FIG. 4 is a diagram of a system of a four stage analog to digital converter with a polynomial nonlinear adaptive filter in accordance with an exemplary embodiment of the present invention.

FIG. 4 is a diagram of a system 400 of a four stage analog to digital converter with an adaptive filter in accordance with an exemplary embodiment of the present invention. Although four stages are shown, any suitable number of stages can be used to provide the desired analog to digital conversion accuracy.

System 400 uses a vectorizer 410 that receives the outputs $D_1$ through $D_4$ of the four stages (402, 404, 406, 408) and generates the higher order powers and cross products of those digital outputs. A nonlinear adaptive filter 412 applies a weighted combination or summation of the outputs produced by each stage, their higher order powers and cross products.

In one exemplary embodiment, a four stage analog to digital converter with outputs $D_1$, $D_2$, $D_3$, and $D_4$ can utilize a vectorizer 412 that generates the following regressors:

$2^{nd}$ Order $D_1^2, D_2^2, D_3^2, D_4^2, D_2 \cdot D_3, D_2 \cdot D_4, D_3 \cdot D_4 \ldots$, $3^{rd}$ Order $D_1^3, D_2^3, D_3^3, D_4^3, D_2^2 \cdot D_3, D_2 \cdot D_3^2, D_2 \cdot D_4^2, D_3 \cdot D_4^2, D_3^2 \cdot D_4, D_2 \cdot D_3 \cdot D_4 \ldots$, and $4^{th}$ and higher orders powers and cross products. However, the total number of cross products can be reduced by selecting the cross products that have the greatest affect on the output, and by excluding the other cross products that have a negligible effect. The selection of cross products can be performed by running a number of conversion samples using all cross products during a design phase, and selecting the cross products that are found to have the greatest effect on the output. An additional advantage obtained by reducing the number of cross products is an increase in stability. The resulting set of efficient cross products (or regressors) for one exemplary four stage analog to digital converter is:

$D_2^3, D_3^3, D_4^3, D_2^2 \cdot D_3, D_2 \cdot D_3^2, D_3 \cdot D_4^2, D_3^2 \cdot D_4$ which can be used to achieve up to 12-bit accuracy. Similar embodiments can be used for less or more stages, or when higher accuracy is desired.

The regressors $u_k$ are assigned to the cross products of the vectorizer 410 in accordance with the following relationships:

| Regressor | Definition |
|---|---|
| $u_1$ | $D_1$ |
| $u_2$ | $D_2$ |
| $u_3$ | $D_3$ |
| $u_4$ | $D_4$ |
| $u_5$ | $D_2^3$ |
| $u_6$ | $D_3^3$ |
| $u_7$ | $D_4^3$ |
| $u_8$ | $D_2^2 \cdot D_3$ |
| $u_9$ | $D_2 \cdot D_3^2$ |
| $u_{10}$ | $D_3 \cdot D_4^2$ |
| $u_{11}$ | $D_3^2 \cdot D_4$ |

Each regressor is weighted by a coefficient $W_k$ and summed by the nonlinear filter 412 to generate the output $x_1$ given by $$x_1 = \sum_{k=1}^{11} W_k \cdot u_k$$

An error signal ($e = y - x_1$) is generated by the difference between the high speed and inaccurate analog to digital converter stages ($x_1$) and the low speed and accurate reference input (y) by the subtractor 414. The coefficients $W_k$ of the nonlinear adaptive filter 412 can be updated using the equation:

$$W_k^{(t+1)} = W_k^{(t)} + \mu * e^{(t)} * u_k^{(t)} \text{ for } k=1, 2, \ldots 11$$

where
the estimation error $e = y - x_1$,
y = the output from the low speed and accurate analog to digital converter,
$x_1$ = the digital estimate,
$W_k$ is adapted such as to minimize the error, and
$\mu_k$ is a user determined step size which can be positive or negative.

Figure 5:
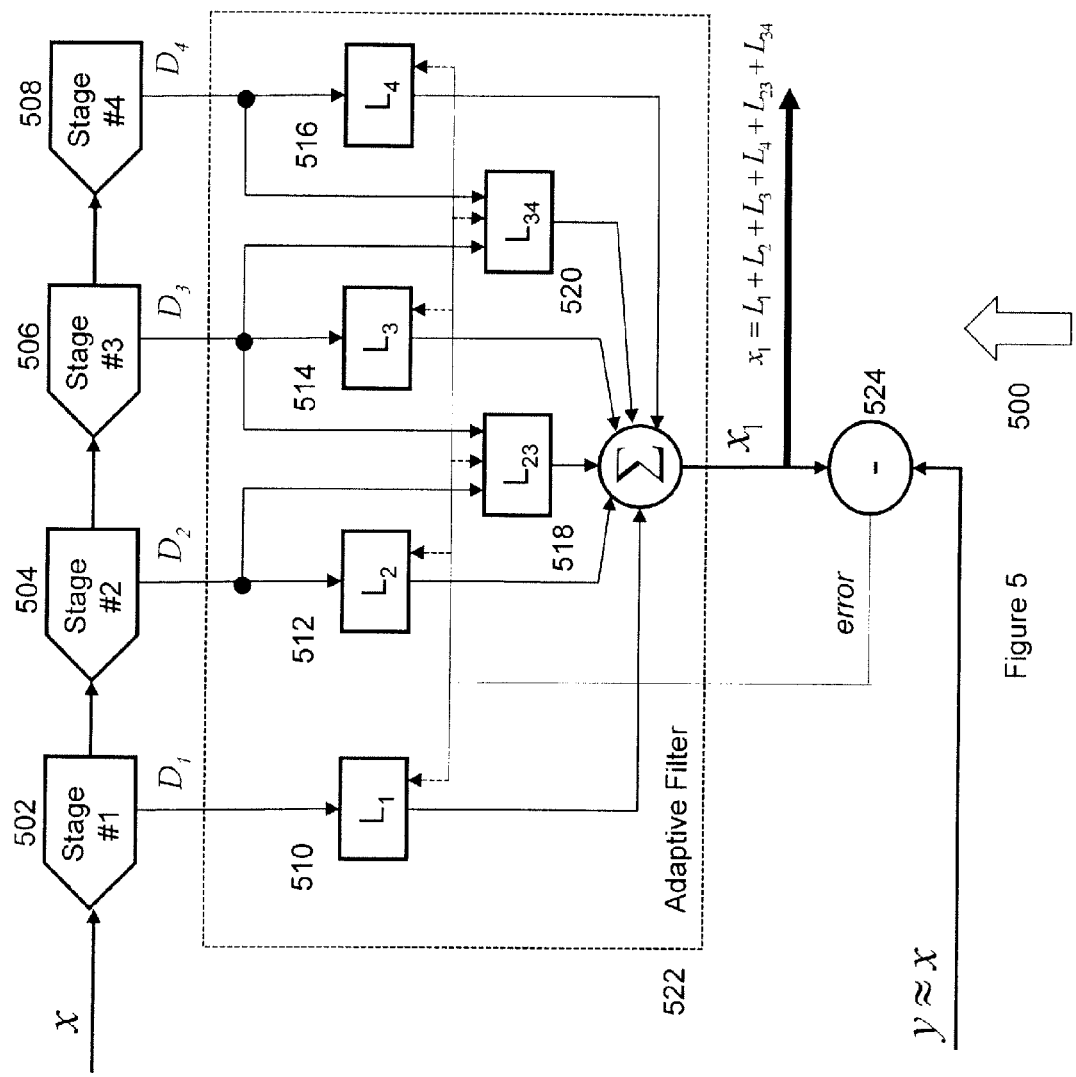
FIG. 5 is a diagram of a system of a four stage analog to digital converter with a look-up table based nonlinear filter in accordance with an exemplary embodiment of the present invention.

FIG. 5 is a diagram of a system 500 of a four stage analog to digital converter 502, 504, 508, 510 with a look-up table based nonlinear filter in accordance with an exemplary embodiment of the present invention. Although four stages are shown, any suitable number of stages can be used to provide the desired analog to digital conversion accuracy. The randomizers in each stage are disabled in this exemplary embodiment.

System 500 includes look-up tables 510, 512, 514, 516 based on outputs $D_{1:4}$ from each stage as well as look-up tables based on the cross products of the outputs 518, 520. The outputs of the table lookups are summed together.

The contents of the look-up tables $L_k$ 510, 512, 514, 516 include the higher-order powers and sums-of-powers of the outputs of the $k^{th}$ stage. The contents of look-up tables $L_{jk}$ include the cross-products and sums-of-cross-products of the $j^{th}$ stage 518 and the $k^{th}$ stage 520. The output of the nonlinear filter 522 is given by the sum of the outputs of the look-up tables as described by the equation $$x_1 = L_1(D_1) + L_2(D_2) + L_3(D_3) + L_4(D_4) + L_{23}(D_2, D_3) + L_{34}(D_3, D_4)$$

The nonlinear filter 522 corrects for nonlinearities in the digital to analog converters and amplifier nonlinearities in each stage.

The error values generated by the difference 524 between the low speed accurate reference value y and the high speed inaccurate analog to digital conversion output $x_1$ are used to update the look-up tables in accordance with the equations $$L_k^{(t+1)}(D_k^{(t)}) = L_k^{(t)}(D_k^{(t)}) + \mu * e^{(t)} \text{ for } k=1, 2, 3, 4$$

and $$L_{jk}^{(t+1)}(D_j^{(t)}, D_k^{(t)}) = L_{jk}^{(t)}(D_j^{(t)}, D_k^{(t)}) + \mu * e^{(t)} \text{ for } (j,k) = (2,3), (3,4)$$

In this manner, look-up tables can be updated based on a user defined step size $\mu$ which can be positive or negative and the error signals to provide a high speed analog to digital converter that has an output that is corrected to compensate for nonlinearity and variance of circuit components.

Figure 6:
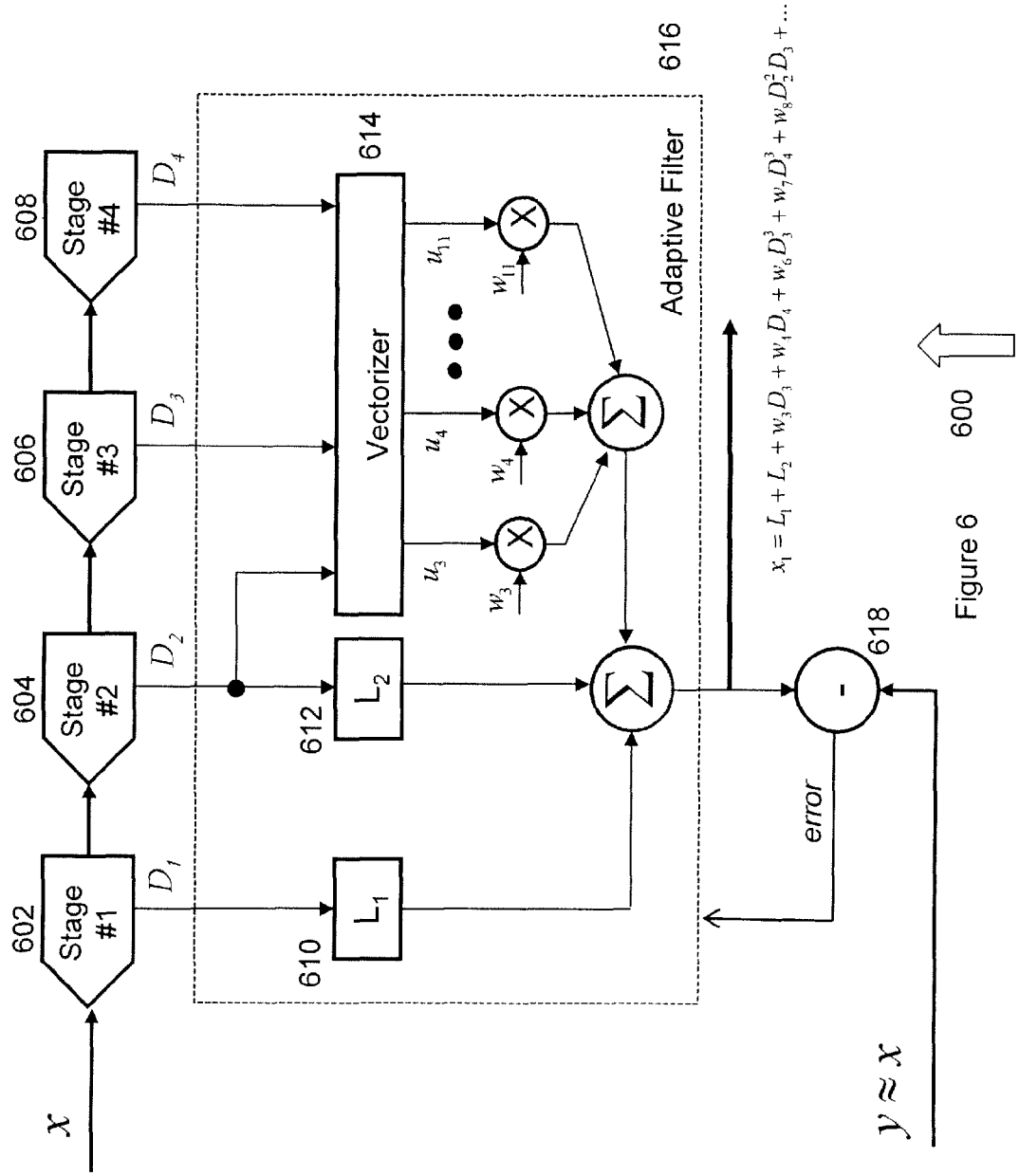
FIG. 6 is a diagram of a system of a four stage analog to digital converter with a hybrid look-up table and adaptive nonlinear filter in accordance with an exemplary embodiment of the present invention.

FIG. 6 is a diagram of a system 600 of a four stage analog to digital converter 602, 604, 606, 608 with a hybrid look-up table and adaptive filter in accordance with an exemplary embodiment of the present invention. Although four stages are shown, any suitable number of stages can be used to provide the desired analog to digital conversion accuracy.

A hybrid approach can be adapted that utilizes a combination of look-up tables and an adaptive nonlinear filter, as shown in system 600. This hybrid approach can be used to avoid the need for look-up tables for cross products, which may tend to be larger in size. Table $L_1$ 610 stores the nonlinear functions of $D_1$. Similarly, Table $L_2$ 612 includes the sum of all relevant linear and higher-order powers and sums thereof of the second stage output $D_2$. Vectorizer 614 generates all other higher order powers and cross products. In one exemplary embodiment of a four stage analog to digital converter with outputs $D_1$, $D_2$, $D_3$, and $D_4$, vectorizer 614 can generate the following regressors:

$2^{nd}$ Order $D_3^2, D_4^2, D_2 \cdot D_3, D_2 \cdot D_4, D_3 \cdot D_4 \ldots$, $3^{rd}$ Order $D_3^3, D_4^3, D_2^2 \cdot D_3, D_2 \cdot D_3^2, D_2 \cdot D_4^2, D_3 \cdot D_4^2, D_3^2 \cdot D_4, D_2 \cdot D_3 \cdot D_4 \ldots$, and other $4^{th}$ and higher orders. However, the total number of cross products can be reduced by selecting key cross products with greatest affect on the output, as previously described. Also, stability can be improved as the number of cross products is reduced. Similar embodiments can be done for less or more stages. In one exemplary embodiment, the resulting set of high efficiency products for a four-stage analog to digital converter can be:

$D_3^3, D_4^3, D_2^2 \cdot D_3, D_2 \cdot D_3^2, D_3 \cdot D_4^2, D_3^2 \cdot D_4$.

Other suitable combinations of regressors can be also be used, and can also be selected for use with less or more stages. In this exemplary embodiment, each cross product (or regressor) is assigned a coefficient $W_k$. The regressors $u_k$ are assigned to the outputs of the vectorizer 614 in accordance with the following relationships:

| Regressor | Definition |
| --- | --- |
| $u_3$ | $D_3$ |
| $u_4$ | $D_4$ |
| $u_5$ | $D_3^3$ |
| $u_6$ | $D_4^3$ |
| $u_7$ | $D_2^2 \cdot D_3$ |
| $u_8$ | $D_2 \cdot D_3^2$ |
| $u_9$ | $D_3 \cdot D_4^2$ |
| $u_{10}$ | $D_3^2 \cdot D_4$ |

Each cross product is assigned a coefficient $W_k$. The regressors are weighted and summed to create the output $x_1$ given by $$x_1 = L_1(D_1) + L_2(D_2) + \sum_{k=3}^{10} u_k w_k$$

An error signal e is generated by the difference between the high speed and inaccurate analog to digital converter stages $x_1$ and the low speed and accurate reference y by subtractor 618, which generates $e=y-x_1$. The error signal is used to adapt the Table look-ups $L_1$ and $L_2$ as follows $L_1^{(t+1)}(D_1^{(t)}) = L_1^{(t)}(D_1^{(t)}) + \mu * e^{(t)}$ $L_2^{(t+1)}(D_2^{(t)}) = L_2^{(t)}(D_2^{(t)}) + \mu * e^{(t)}$ The coefficients $W_k$ of the nonlinear adaptive filter 616 can be updated using the equation:

$W_k^{(t+1)} = W_k^{(t)} + \mu * e^{(t)} * u_k^{(t)}$ for $k=3, 4, \ldots 10$ where $\mu_k$ is a user defined step size that can be positive or negative.

Figure 7:
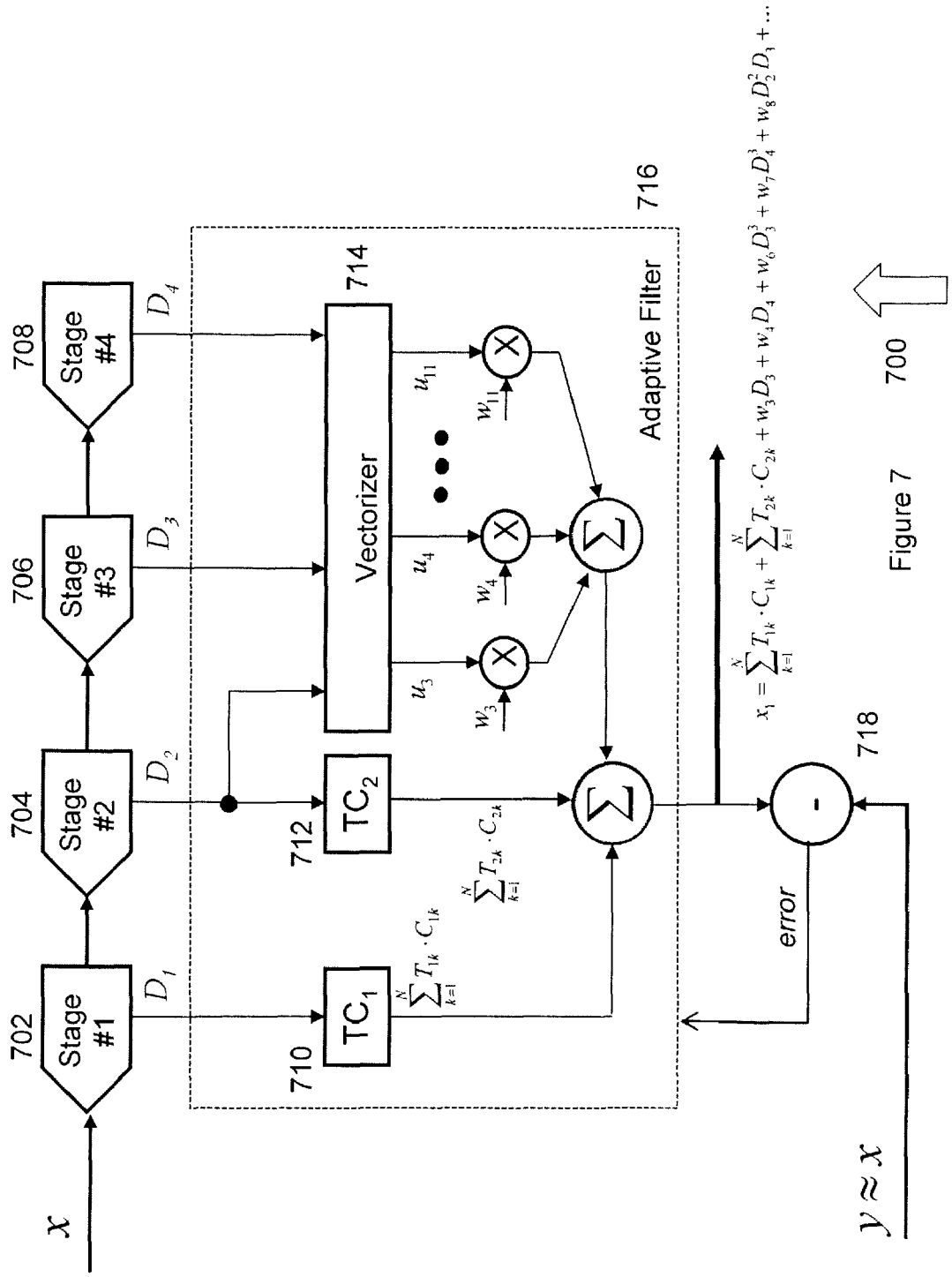
FIG. 7 is a diagram of a system of a four stage analog to digital converter with a hybrid thermometer code correction and adaptive nonlinear filter in accordance with an exemplary embodiment of the present invention.

FIG. 7 is a diagram of a system 700 of a four stage 702, 704, 706, 708 analog to digital converter with adaptive hybrid thermometer code correction 710 and 712 and vectorizer 714 to implement the nonlinear adaptive filter 716 in accordance with an exemplary embodiment of the present invention. Although four stages are shown, any suitable number of stages can be used to provide the desired analog to digital conversion accuracy.

System 700 uses a randomized thermometer code in each stage that distributes the thermometer code values so as to prevent over-reliance on a small group of unit capacitors of the digital to analog converter. For example, the 4-b thermometer code [0001] can be randomized as either [0010], [0100] or [1000], so as to ensure that effect on the analog voltages generated by the digital to analog converter caused by variances in the values of capacitors of the digital to analog converter are randomly distributed. More importantly, the digital estimates of the unit capacitors can be estimated independent of input amplitude statistics. Once the unit capacitors in the digital to analog converter of a stage are estimated, the digital output of the digital to analog converter in a stage can be accurately represented by $$\sum_{k=1}^{N} T_k C_k$$

where the $T_k$ are the N thermometer codes and the $C_k$ are the estimates of the N unit capacitances. This exemplary embodiment can be used to reproduce the effects of variations in the capacitor values in the operation of the digital to analog converter.

In one exemplary embodiment of a four stage analog to digital converter with outputs $D_1, D_2, D_3$, and $D_4$, vectorizer 714 can generate the following regressors:

$2^{nd}$ Order $D_2^2, D_3^2, D_4^2, D_2 \cdot D_3, D_2 \cdot D_4, D_3 \cdot D_4 \ldots$, $3^{rd}$ Order $D_2^3, D_3^3, D_4^3, D_2^2 \cdot D_3, D_2 \cdot D_3^2, D_2 \cdot D_4^2, D_3 \cdot D_4^2, D_3^2 \cdot D_4, D_2 \cdot D_3 \cdot D_4 \ldots$, and other $4^{th}$ and higher orders. However, the total number of cross products can be reduced by selecting key cross products with greatest affect on the output, as previously described. Also, stability can be improved as the number of cross products is reduced. Other exemplary embodiments can also be used for less or more stages. In one exemplary embodiment, the set of high efficiency products for a four stage analog to digital converter can be:

$D_2^3, D_3^3, D_4^3, D_2^2 \cdot D_3, D_2 \cdot D_3^2, D_3 \cdot D_4^2, D_3^2 \cdot D_4$.

In this exemplary embodiment, the regressors $u_k$ can be assigned to the outputs of vectorizer 714 in accordance with the following relationships:

| Regressor | Definition |
| --- | --- |
| $u_3$ | $D_3$ |
| $u_4$ | $D_4$ |
| $u_5$ | $D_2^3$ |
| $u_6$ | $D_3^3$ |
| $u_7$ | $D_4^3$ |
| $u_8$ | $D_2^2 \cdot D_3$ |
| $u_9$ | $D_2 \cdot D_3^2$ |
| $u_{10}$ | $D_3 \cdot D_4^2$ |
| $u_{11}$ | $D_3^2 \cdot D_4$ |

Other exemplary embodiments can provided for less or more stages. Each cross product is assigned a coefficient $W_k$. The products are weighted and summed by the nonlinear filter 716 to create the output $x_1$ given by $$x_1 = \sum_{k=1}^{N} T_{1k}C_{1k} + \sum_{k=1}^{N} T_{2k}C_{2k} + \sum_{k=3}^{11} u_k w_k$$

The error signal of system 700 is processed according to the equation $e = y - x_1$. The coefficients $W_k$ of the nonlinear adaptive filter 716 can be updated using the equation:

$$W_k^{(t+1)} = W_k^{(t)} + \mu * e^{(t)} * u_k^{(t)} \text{ for } k=3, 4, \ldots 11$$

The digital estimates of the unit capacitors $C_{1k}$ and $C_{2k}$ used in adaptive hybrid thermometer code correction 710 and 712 can be updated using the equations $$C_{1k}^{(t+1)} = C_{1k}^{(t)} + \mu * e^{(t)} * T_{1k}^{(t)} \text{ for } k=1, \ldots N$$

$$C_{2k}^{(t+1)} = C_{2k}^{(t)} + \mu * e^{(t)} * T_{2k}^{(t)} \text{ for } k=1, \ldots N$$

Where $\mu$ is a user defined step size that can be positive or negative.

Figure 8:
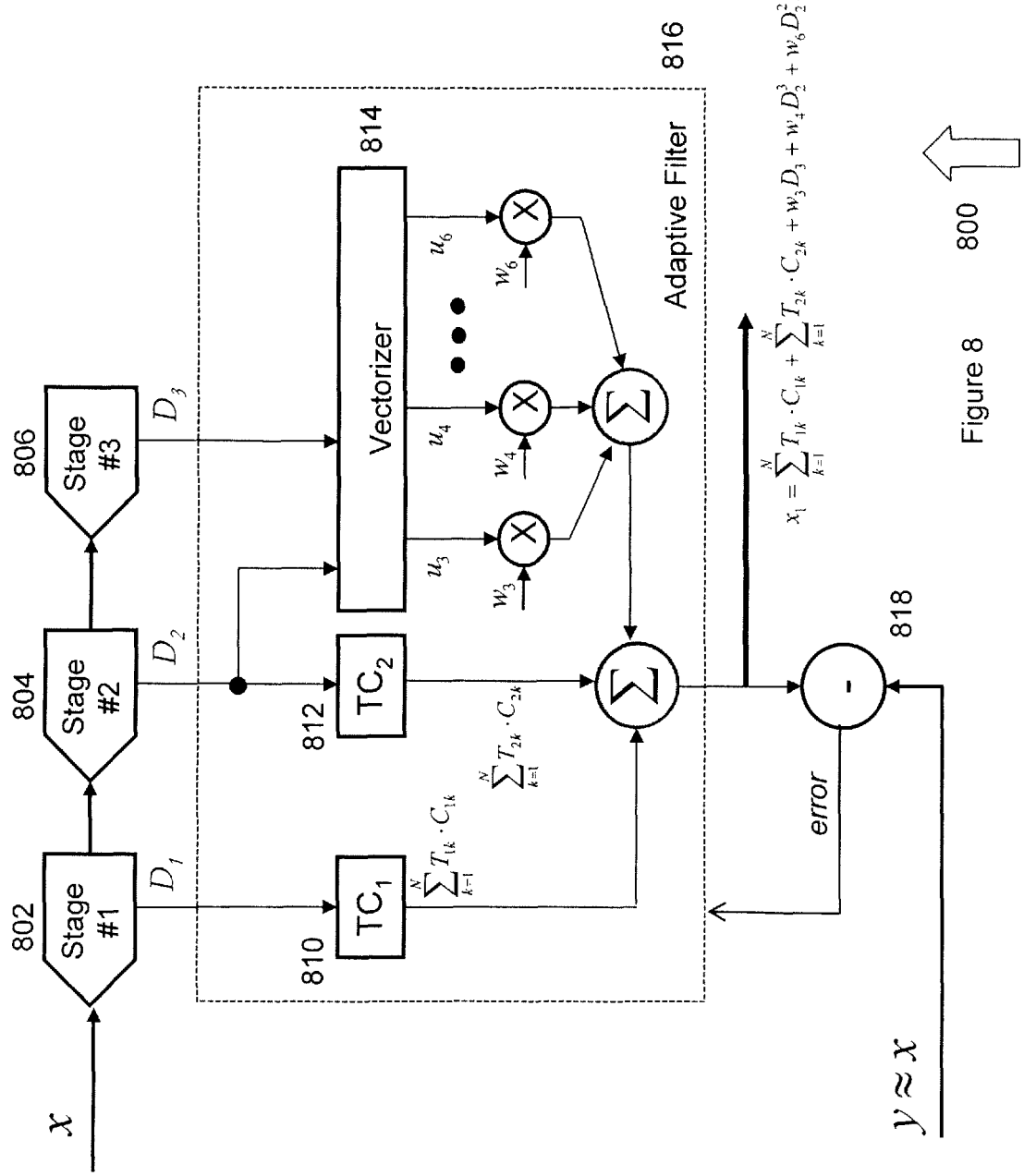
FIG. 8 is a diagram of a system of a three stage analog to digital converter with adaptive hybrid thermometer code correction and vectorizer to implement the nonlinear adaptive filter in accordance with an exemplary embodiment of the present invention.

FIG. 8 is a diagram of a system 800 of a three stage 802, 804, 806 analog to digital converter with adaptive hybrid thermometer code correction 810 and 812 and vectorizer 814 to implement the nonlinear adaptive filter 816 in accordance with an exemplary embodiment of the present invention. Although three stages are shown, any suitable number of stages can be used to provide the desired analog to digital conversion accuracy.

System 800 uses a randomized thermometer code in each stage that distributes the thermometer code values so as to prevent over-reliance on a small group of unit capacitors of the digital to analog converter. For example, the 4-b thermometer code [0001] can be randomized as either [0010], [0100] or [1000], so as to ensure that effect on the analog voltages generated by the digital to analog converter caused by variances in the values of capacitors of the digital to analog converter are randomly distributed. In addition, the digital estimates of the unit capacitors can be estimated independently of input amplitude statistics. Once the unit capacitors in the digital to analog converter of a stage are estimated, the digital output of the digital to analog converter in a stage can be accurately represented by $$\sum_{k=1}^{N} T_k C_k$$

where the $T_k$ are the N thermometer codes and the $C_k$ are the estimates of the N unit capacitances. This representation can be used to reproduce the effects of variations in the capacitor values in the operation of the digital to analog converter.

In one exemplary embodiment of a three stage analog to digital converter with outputs $D_1$, $D_2$, and $D_3$, vectorizer 814 can generates the following regressors:

$2^{nd}$ Order $D_2^2, D_3^2, D_2 \cdot D_3, \ldots,$ $3^{rd}$ Order $D_2^3, D_3^3, D_2^2 \cdot D_2 \cdot D_3^2, \ldots,$ and other $4^{th}$ and higher orders. However, the total number of cross products can be reduced by selecting key cross products with greatest affect on the output, as previously described. Also, stability can be improved as the number of cross products is reduced. Similar embodiments can be done for less or more stages. In one exemplary embodiment, the resulting set of high efficiency products can be:

$D_2^3, D_3^3, D_2^2 \cdot D_3$.

In this exemplary embodiment, the regressors $u_k$ are assigned to the outputs of vectorizer 714 in accordance with the following relationships:

| Regressor | Definition |
|---|---|
| $u_3$ | $D_3$ |
| $u_4$ | $D_2^3$ |
| $u_5$ | $D_3^3$ |
| $u_6$ | $D_2^2 \cdot D_3$ |

Other suitable embodiments can be used for less or more stages. Each cross product is assigned a coefficient $W_k$. The products can be weighted and summed by nonlinear filter 816 to create the output $x_1$ given by $$x_1 = \sum_{k=1}^{N} T_{1k}C_{1k} + \sum_{k=1}^{N} T_{2k}C_{2k} + \sum_{k=3}^{11} u_k w_k$$

The error signal of system 800 is processed according to the equation $e = y - x_1$. The coefficients $W_k$ of nonlinear adaptive filter 816 can be updated using the equation:

$$W_k^{(t+1)} = W_k^{(t)} + \mu * e^{(t)} * u_k^{(t)} \text{ for } k=1, \ldots 11$$

The digital estimates of the unit capacitors $C_{1k}$ and $C_{2k}$ in adaptive hybrid thermometer code correction 810 and 812 can be updated using the equations $$C_{1k}^{(t+1)} = C_{1k}^{(t)} + \mu * e^{(t)} * T_{1k}^{(t)} \text{ for } k=1, \ldots N$$

$$C_{2k}^{(t+1)} = C_{2k}^{(t)} + \mu * e^{(t)} * T_{2k}^{(t)} \text{ for } k=1, \ldots N$$

Where $\mu$ is a user defined step size that can be positive or negative.

While certain exemplary embodiments have been described in detail and shown in the accompanying drawings, it is to be understood that such embodiments are merely illustrative of and not restrictive on the broad invention. It will thus be recognized to those skilled in the art that various modifications may be made to the illustrated and other embodiments of the invention described above, without departing from the broad inventive scope thereof. It will be understood, therefore, that the invention is not limited to the particular embodiments or arrangements disclosed, but is rather intended to cover any changes, adaptations or modifications which are within the scope and the spirit of the invention defined by the appended claims.

What is claimed is:

1. An apparatus for converting an analog signal to a digital signal comprising:
   a. logic configured to nonlinearly combine the outputs of analog to digital stages of an analog to digital converter to improve an accuracy of an analog to digital conversion; and
   b. logic configured to update one or more correction factors based on a difference between outputs of a corrected analog to digital converter value and a second reference digital value, the logic comprising:

a vectorizer configured to generate a plurality of regressors that include the powers of the outputs and the cross products of the powers of the outputs of at least one of the analog to digital converter stages; and an adaptive filter configured to generate a weighted sum of the regressors and for updating the weights applied to the regressors.

2. The apparatus of claim 1 wherein the logic further comprises:

a. one or more look-up tables configured to store the one or more correction factors; and b. wherein the adaptive filter is further configured to generate a sum of the outputs of the look-up tables and the weighted sum of the regressors, and to update the contents of the look-up tables.

3. The apparatus of claim 2 wherein the one or more look-up tables are configured to store correction factors for at least one stage of the analog to digital converter.

4. The apparatus of claim 1 wherein the logic further comprises:

a. logic configured to store estimates of unit elements in one or more stages of an analog to digital converter; and b. a randomizer for scrambling thermometer codes that are utilized by each stage of the analog to digital converter d. wherein the adaptive filter is further configured to generate a sum of the thermometer codes weighted by the estimates of the unit elements for one or more stage of the digital to analog converter and the weighted sum of the regressors, and update the estimates of the unit elements and weights applied to the regressors.

5. A method for converting an analog signal to a digital signal comprising:

a. nonlinearly combining outputs of an analog to digital converter to improve an accuracy of an analog to digital conversion;

b. updating one or more correction factors based on a difference between the outputs of the analog to digital converter and a second reference digital value;

c. generating a plurality of regressors that are powers of the outputs and cross products of the powers of the outputs of at least one stage of the analog to digital converter; and d. generating a weighted sum of the regressors; and e. updating the weights applied to the regressors.

6. The method of claim 5 further comprising:

a. storing the correction factors in a plurality of look-up tables; and b. adding the outputs of the look-up tables and the weighted sum of the regressors; and c. updating the contents of the look-up tables.

7. The method of claim 6 wherein the correction factors are for at least one stage of the analog to digital converter.

8. The method of claim 5 further comprising:

a. storing estimates of unit elements in one or more stages of an analog to digital converter;

b. scrambling one or more thermometer codes that drive a digital to analog converter in at least one of the analog to digital converter stages;

c. generating the sum of the thermometer codes weighted by the estimates of the unit elements for the stages and the weighted sum of the regressors;

d. updating the estimates of the unit elements.

9. A system for converting an analog signal to a digital signal comprising:

a. means for improving an accuracy of an analog to digital converter; and b. means for updating correction factors based on a difference between an output of the analog to digital converter value and a second reference digital value;

c. wherein the means for improving the accuracy of the analog to digital converter comprises:

a vectorizer configured to generate a plurality of regressors that are powers of the outputs and the cross products of the powers of the outputs of one or more stages of the analog to digital converter; and an adaptive filter configured to generate a weighted sum of the regressors and to update the weights applied to the regressors.

10. The system of claim 9 wherein the means for improving the accuracy of the analog to digital converter further comprises:

a. means for using a plurality of look-up tables for storing the correction factors; and b. wherein the adaptive filter is further configured to generate the sum of the outputs of the look-up tables and the weighted sum of the regressors and to update the contents of the look-up tables.

11. The system of claim 10 wherein the correction factors are for at least one stage of the analog to digital converter.

12. The system of claim 9 wherein the means for improving the accuracy of the analog to digital converter further comprises:

a. means for using logic for storing estimates of unit elements in each stage of the analog to digital converter;

b. means for using a randomizer for scrambling thermometer codes that drive a digital to analog converter in at least one stage of the analog to digital converter;

d. wherein the adaptive filter is configured to generate a sum of the thermometer codes weighted by the estimates of the unit elements and the weighted sum of the regressors, and for updating the estimates of the unit elements.

13. The apparatus of claim 4, wherein the unit elements are capacitors.

14. The apparatus of claim 4, wherein the unit elements are current cells.

15. The method of claim 8, wherein the unit elements are capacitors.

16. The method of claim 8, wherein the unit elements are current cells.

17. The system of claim 12, wherein the unit elements are capacitors.

18. The system of claim 12, wherein the unit elements are current cells.

* * * * *